United States Patent
Lymberopoulos et al.

(10) Patent No.: US 7,265,382 B2
(45) Date of Patent: Sep. 4, 2007

(54) METHOD AND APPARATUS EMPLOYING INTEGRATED METROLOGY FOR IMPROVED DIELECTRIC ETCH EFFICIENCY

(75) Inventors: Dimitris Lymberopoulos, San Jose, CA (US); Gary Hsueh, San Francisco, CA (US); Sukesh Mohan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/293,595

(22) Filed: Nov. 12, 2002

(65) Prior Publication Data

US 2004/0092047 A1    May 13, 2004

(51) Int. Cl.
- H01L 23/58   (2006.01)
- H01L 21/66   (2006.01)
- G01N 23/00   (2006.01)

(52) U.S. Cl. ......... 257/48; 257/E21.521; 257/E21.529; 438/14; 250/310; 250/492.23; 250/492

(58) Field of Classification Search ............ 156/345.24
See application file for complete search history.

(56) References Cited

U.S. PATENT DOCUMENTS

| | | |
|---|---|---|
| 4,447,731 A | 5/1984 | Kuni et al. |
| 5,109,430 A | 4/1992 | Nishihara et al. |
| 5,452,521 A | 9/1995 | Niewmierzycki |
| 5,653,894 A | 8/1997 | Ibbotson et al. |
| 5,913,102 A | 6/1999 | Yang |
| 5,926,690 A | 7/1999 | Toprac et al. .................. 438/17 |
| 5,944,940 A | 8/1999 | Toshima |

(Continued)

FOREIGN PATENT DOCUMENTS

EP     0727715     8/1996

(Continued)

OTHER PUBLICATIONS

Ausschnit, Christopher P., et al., "Seeing the Forest for the Trees: A New Approach to CD Control," Ed. Bhanwar Singh, Proceedings of the SPIE, vol. 3332, pp. 212-220, Feb. 23-25, 1998.

(Continued)

*Primary Examiner*—Alonzo Chambliss
(74) *Attorney, Agent, or Firm*—McDermott, Will & Emery

(57) ABSTRACT

A method and apparatus for processing a semiconductor wafer is provided for reducing dimensional variation by feeding forward information relating to photoresist mask CD and profile and underlying layer thickness measured at several points on the wafer to adjust the next process the inspected wafer will undergo (e.g., the etch process). After the processing step, dimensions of a structure formed by the process, such as the CD and depth of a trench formed by the process, are measured at several points on the wafer, and this information is fed back to the process tool to adjust the process for the next wafer to further reduce dimensional variation. In certain embodiments, the CD, profile, thickness and depth measurements, etch processing and post-etch cleaning are performed at a single module in a controlled environment. All of the transfer and processing steps performed by the module are performed in a clean environment, thereby increasing yield by avoiding exposing the wafer to the atmosphere and possible contamination between steps.

10 Claims, 10 Drawing Sheets

U.S. PATENT DOCUMENTS

| | | | |
|---|---|---|---|
| 5,948,203 A | 9/1999 | Wang | |
| 5,963,329 A | 10/1999 | Conrad et al. | |
| 5,980,766 A | 11/1999 | Flamm et al. | |
| 6,001,699 A | 12/1999 | Nguyen et al. | |
| 6,004,706 A | 12/1999 | Ausschnitt et al. | |
| 6,007,675 A | 12/1999 | Toshima | |
| 6,027,842 A | 2/2000 | Ausschnitt et al. | |
| 6,033,814 A | 3/2000 | Burdorf et al. | |
| 6,054,710 A | 4/2000 | Bruggman | |
| 6,143,081 A | 11/2000 | Shinriki et al. | |
| 6,148,239 A | 11/2000 | Funk et al. | |
| 6,161,054 A | 12/2000 | Rosenthal et al. | |
| 6,175,417 B1 | 1/2001 | Do et al. | |
| 6,178,239 B1 | 1/2001 | Kishinsky et al. | |
| 6,225,639 B1 | 5/2001 | Adams et al. | |
| 6,245,581 B1 | 6/2001 | Bonser et al. | |
| 6,388,253 B1 | 5/2002 | Su .............................. | 250/310 |
| 6,424,417 B1 | 7/2002 | Cohen et al. ................ | 356/388 |
| 6,625,512 B1 * | 9/2003 | Goodwin ..................... | 700/121 |
| 2002/0155629 A1 | 10/2002 | Fairbaim et al. | |
| 2002/0171828 A1 | 11/2002 | Cohen et al. | |

FOREIGN PATENT DOCUMENTS

| | | |
|---|---|---|
| EP | 1079428 | 2/2001 |
| EP | 1083424 | 3/2001 |
| JP | 61290312 | 12/1986 |
| WO | WO 01/84382 | 11/2001 |
| WO | WO 02/09170 | 1/2002 |

OTHER PUBLICATIONS

Moharam, M.G., et al., "Stable Implementation of the Rigorous Coupled-Wave Analysis for Surface-Relief Gratings: Enhanced Transmittance Matrix Approach," Journal of the Optical Society of America, vol. 12, No. 5, pp. 1077-1086, May 1995.

Chateau, Nicolas, "Algorithm for the Rigorous Coupled-Wave Analysis of Grating Diffusion," Journal of the Optical Society of America, vol. 11, No. 4, pp. 1321-1331, Apr. 1994.

"An Inverse Scattering Approach to SEM Line Width Measurements", Mark P. Davidson et al., Proceedings of SPIE vol. 3677, Mar. 15-18, 1999.

"Angle-resolved scatterometry for semiconductor manufacturing", Christopher J. Raymond, Microlithograph World, Winter 2000.

European Search Report dated Mar. 3, 2001.

AMD's Advancd Process Control of Poly-gate Critical Dimension, Anthony J. Toprac, SPIE vol. 3682, Sep. 1999, pp. 62-65.

"Analysis of Reflectometry and Ellipsometry Data from Patterned Structures", M.E. Lee et al., 1998 American Institute of Physics, pp. 331-335.

"Approach to CD SEM metrology utilizing the full waveform signal", John M. McIntosh et al, SPIE vol. 3332, pp. 51-60.

"Integrated CD Metrolog for Poly Si Etching", G.P. Kota et al., Lam Research Corporation, Plasma Etch Users Group Meeting, Jan. 17, 2002.

US 6,150,664, 11/2000, Su (withdrawn)

\* cited by examiner

METHOD AND APPARATUS EMPLOYING INTEGRATED METROLOGY FOR IMPROVED DIELECTRIC ETCH EFFICIENCY

FIELD OF THE INVENTION

The present invention relates to a method and apparatus for monitoring and controlling processing carried out on a semiconductor substrate, and more particularly for controlling the uniformity of critical dimensions (CDs) and profiles of features formed on the semiconductor substrate through feedback and feed-forward of information gathered during in-process inspection of the features. The invention has particular applicability for in-line inspection of semiconductor wafers during manufacture of high-density semiconductor devices with submicron design features.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of separate conductive lines, and a plurality of interconnect lines, such as bus lines, bit lines, word lines and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as a "damascene" process. Generally, this process involves forming a via opening in the inter-metal dielectric layer or interlayer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical mechanical polishing (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

One important technique for implementing damascene processes (as well as other processes) is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be formed on the wafer. Each mask in the series is used to transfer its corresponding pattern onto a photosensitive layer (i.e., a photoresist layer) which has been previously coated on an underlying layer, such as a polysilicon, nitride or metal layer, formed on the silicon wafer. The transfer of the mask pattern onto the photoresist layer is conventionally performed by an optical exposure tool such as a scanner or a stepper, which directs light or other radiation through the mask to expose the photoresist. The photoresist is thereafter developed to form a photoresist mask, and the underlying layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. The design rule limitation is referred to as the critical dimension ("CD"), defined as the smallest width of a line or the smallest space between two lines permitted in the fabrication of the device. The CD for most ultra large scale integration applications is on the order of a fraction of a micron.

As design rules shrink and process windows (i.e., the margins for error in processing) become smaller, inspection and measurement of surface features' CD, as well as their cross-sectional shape ("profile") are becoming increasingly important. Deviations of a feature's CD and profile from design dimensions may adversely affect the performance of the finished semiconductor device. Furthermore, the measurement of a feature's CD and profile may indicate photolithography problems, such as stepper defocusing and photoresist loss due to overexposure, and/or etch problems such as improper gas flow and magnetic field intensity.

Thus, CD and profile values, and the variation of feature CD from design dimensions, are important indicators of the accuracy and stability of the photoresist and etch processes, and "CD control" to reduce such variation is an important part of semiconductor processing. CD control necessarily involves monitoring and adjusting both the photolithography and etch processes to address CD variations from field to field (FTF) within a wafer, from wafer to wafer (WTW) and from lot to lot (LTL).

Because of the extremely small scale of current CD's, the instrument of choice for measurement and inspection of surface features produced by photolithographic processing, such as dual damascene processing, is a scanning electron microscope (SEM) known as a "critical dimension scanning electron microscope" (CD-SEM). Although conventional SEM's are useful for measuring CD's, they cannot measure some important parameters, such as thickness of a layer to be etched, and they generally do not provide "real time" metrology. In other words, they do not provide immediate feedback to the photolithography process, or feed-forward to the etcher, to reduce LTL variations. SEM measurement is performed "off-line" because it is relatively slow and typically needs to be performed at a separate review station, with inspection results not being known for hours afterward.

Consequently, the results of conventional SEM inspections are not typically used to adjust subsequent etch processing, so the CD measurement of a particular wafer is not used to decide what etch recipe should be used to process that wafer. Rather, the photoresist mask is formed, and then the wafer is etched, assuming that both the mask formation and etching processes are performing within specifications. As a result, yield is typically low due to an undesirably large amount of scrap. Moreover, as wafer sizes increase to 300 mm diameter and larger, the amount of scrap grows exponentially with metrology delays if a process problem occurs. As a further consequence of the inspection necessarily taking place at a physically separate tool, the wafers must be transferred to and from the tool for every inspection performed. This exposes the wafers to the ambient atmosphere, which can result in unwanted oxidation of the wafer surface or deposition of foreign particles on the surface, thereby lowering yield.

Some conventional dual damascene processing includes controlling the dielectric etch step by time or by an in-situ optical means, such as an interferometric sensor, which monitors trench etch in real time. Typically, a sensor in the center of the lid of the etch chamber measures a die average trench depth while the etch process is taking place. However, only trench depth is measured. No profile information is provided by the interferometric sensor, such as trench sidewall angle, notching, or undercutting. Moreover, etch uniformity across the wafer is not monitored by the interferometric sensor, since only the center dies are "seen" by the sensor. Therefore, dies away from the center may be improperly etched, and the interferometric sensor cannot be used to monitor or correct this situation.

There exists a need for a simple, cost-effective methodology for fast and meaningful identification and correction of CD variation without significantly compromising throughput.

SUMMARY OF THE INVENTION

An advantage of the present invention is the ability to reduce CD variations in semiconductor wafers without reducing throughput, by utilizing information gathered during in-process inspection of the wafers.

According to the present invention, the foregoing and other advantages are achieved in part by a method of processing a semiconductor wafer, comprising forming an underlying layer on the wafer and a patterned layer on the underlying layer; measuring a dimension of a pattern on the patterned layer and the thickness of the underlying layer at a plurality of different predetermined locations on the wafer; selecting a first set of process parameter values for a process to be performed on the wafer, based on the measurements of the dimension and the thickness; performing the process on the wafer at a processing tool using the first set of process parameter values; measuring a dimension of a structure formed in the underlying layer by the process at the predetermined locations; and selecting a second set of process parameter values for a subsequently processed wafer using the measurements of the structure.

Another aspect of the present invention is an apparatus for processing a semiconductor wafer, comprising a measuring tool for measuring the thickness of an underlying layer formed on the wafer and a dimension of a pattern on a patterned layer formed on the underlying layer at a plurality of different predetermined locations on the wafer; a processing tool for performing a process on the wafer using a first set of process parameter values; and a processor configured to select the first set of process parameter values based on the measurements of the dimension and the thickness.

A still further aspect of the present invention is an apparatus for processing a semiconductor wafer, comprising a measuring tool for measuring the thickness of an underlying layer formed on the wafer and a profile and CD of a pattern on a patterned layer formed on the underlying layer at a plurality of different predetermined locations on the wafer; a processing tool for performing a process on the wafer using a first set of process parameter values; a transfer mechanism for transferring the wafer between the measuring tool and the processing tool; a chamber for enclosing the transfer mechanism and allowing communication between the transfer mechanism, the measuring tool and the processing tool in a clean environment; and a processor configured to select the first set of process parameter values based on the measurements of the pattern CD and profile and the underlying layer thickness. The measuring tool is for measuring a CD of a structure formed in the underlying layer by the process at the predetermined locations, and the processor is further configured to select a second set of process parameter values for a subsequently processed wafer using the CD measurements of the structure.

Additional advantages of the present invention will become readily apparent to those skilled in this art from the following detailed description, wherein only exemplary embodiments of the present invention are shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION

Figure 1:
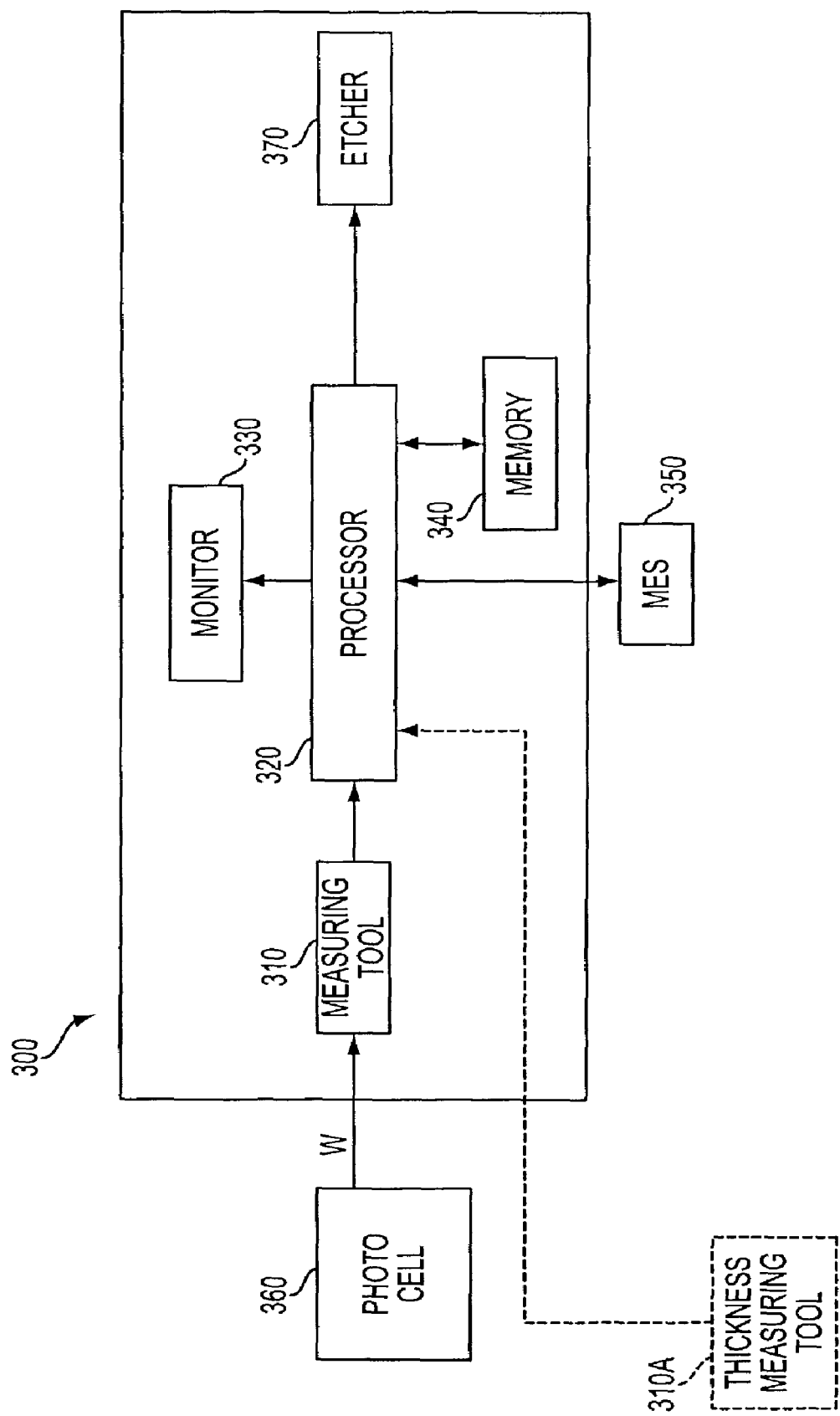
FIG. 1 is a block diagram of an apparatus according to an embodiment of the present invention.

Conventional methodologies for in-process inspection of features formed on the surface of semiconductor wafers are not capable of analyzing CD and/or profile deviations from design rules in sufficient detail to provide information leading to early positive identification of the source of the defect or enabling process control to reduce dimensional variation. The present invention addresses the problem of CD control by reducing the CD variation by feeding forward information relating to photoresist mask CD and profile, and underlying layer thickness measured at several points on the wafer to adjust the next process the inspected wafer will undergo (e.g., the etch process). In certain embodiments of the present invention, the CD, profile and thickness measurement, etch processing and post-etch cleaning are performed at a single module in a controlled environment, thereby increasing throughput and improving yield. Thus, the present invention provides a self-contained etch module capable of receiving any compatible wafer having a photoresist mask formed on its surface, inspecting it, and etch processing it in a closed environment.

According to the methodology of the present invention, an underlying layer, such as a dielectric layer, is formed on a wafer and a patterned layer, such as a photoresist mask, is formed on the underlying layer, as by a photolithography process at a "photo cell" (e.g., exposure at a stepper followed by photoresist development). A pattern on the mask is inspected at several sites on the wafer to measure its CD and profile using an integrated metrology unit, such as an optical inspection tool. The thickness of the underlying layer is also measured at the same sites on the wafer at the same inspection tool. If the CD and/or thickness are not within specification, the wafer is sent back to the photo cell for rework; otherwise, the wafer is transferred to an etch chamber, such as a conventional dielectric etch chamber. The collected CD and thickness data are used by the processor to adjust the etch recipe, also taking into account the implicit etch uniformity performance of the etcher. The processor can adjust gas flow rate, magnetic field intensity, magnetic field profile, etc.

After etching, the wafer is optionally cleaned, as by an ash photoresist strip followed by a wet clean, and transferred back to the integrated metrology unit, where the CD, profile and depth of features formed by the etch process are measured and compared to the desired dimensions. Deviations from desired results can trigger alarms that lead to halting the process. However, such information is normally fed back to the processor to compensate for etch process drift by adjustment of the etch recipe when etching the next wafer.

Prior art techniques typically inspect only the center of the wafer during the etch process, for the purpose of determining the end point of the etch process. By measuring thickness, CD and profile at a plurality of sites across the wafer prior to etching, the present invention effectively looks at the entire wafer, not only at the center of the wafer. The present invention consequently enables a uniform etch to be achieved across the wafer by intentionally operating the etcher in a non-optimal way to compensate for measured CD and thickness variations. Furthemore, since each wafer receives a tailored process to achieve optimum results, there is no need to develop recipes that perform optimally across different applications and products.

An exemplary embodiment of the present invention is implemented using an inspection tool in a processing line 300, as shown in FIG. 1, comprising a measuring tool 310, e.g., an optical inspection tool such as the Nano OCD available from Nanometrics of Milpitas, Calif., or an optical imager as disclosed in U.S. Pat. No. 5,963,329. Optical measuring tool 310 can utilize scatterometry or reflectometry techniques. The use of scatterometry for inspection tools is disclosed in Raymond, "Angle-resolved scatterometry for semiconductor manufacturing", *Microlithography World*, Winter 2000. The use of reflectometry for inspection is taught in Lee, "Analysis of Reflectometry and Ellipsometry Data from Patterned Structures", *Characterization and Metrology for ULSI Technology*: 1998 *International Conference*, The American Institute of Physics 1998. Measuring tool 310 can be a single optical tool, or can comprise two optical tools, one for performing CD and profile measurements, and another for performing thickness measurements.

In an alternative embodiment of the present invention, measuring tool 310 is for optically measuring CD and profile only, and thickness measurements are carried out at a separate conventional thickness measuring tool 310A, shown in FIG. 1 in dotted lines, such as the Nano 9000, available from Nanometrics of Milpitas, Calif., or an optical imager as disclosed in U.S. Pat. No. 5,963,329. Thickness measuring tool 310A can be free-standing or can be incorporated, for example, in a chemical vapor deposition (CVD) tool (not shown).

Processing line 300 further comprises a processor 320, which performs the analysis disclosed herein electronically, and a monitor 330 for displaying results of the analyses of processor 320. Processor 320 can be in communication with a memory device 340, such as a semiconductor memory, and a computer software-implemented database system 350 known as a "manufacturing execution system" (MES) conventionally used for storage of process information. Processor 320 is also in communication with previously-described measuring tool 310 (as well as with measuring tool 310A where applicable) and with a conventional etcher 370.

Figure 2:
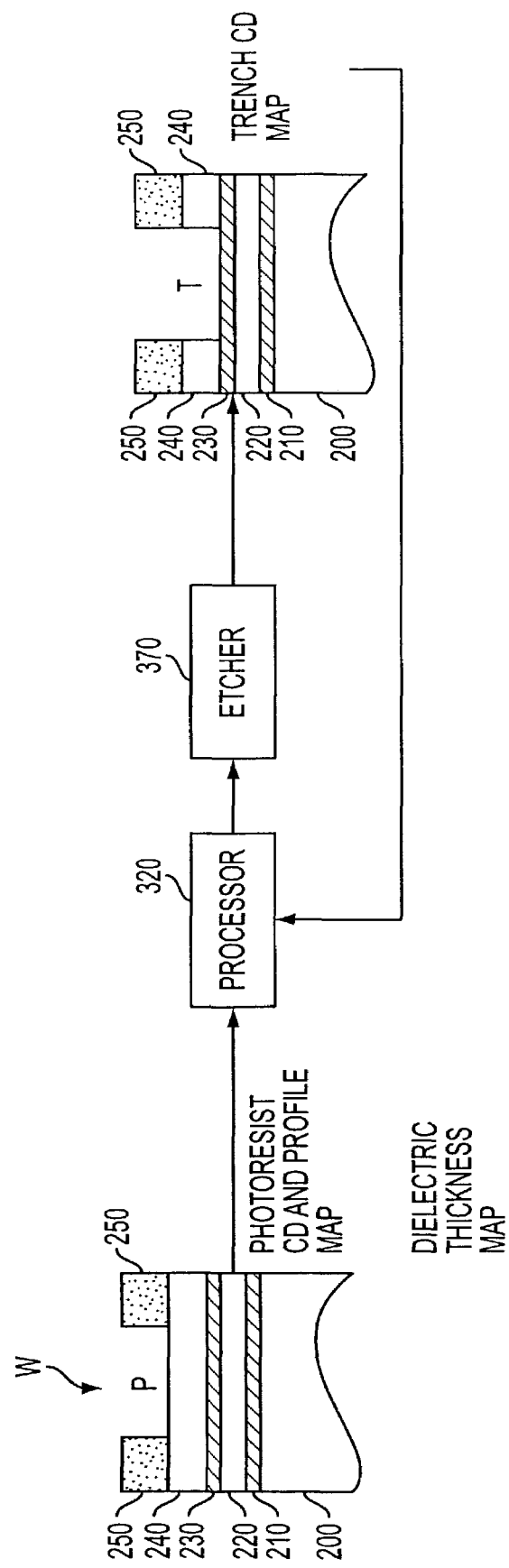
FIG. 2 is a process flow diagram for an embodiment of the present invention.

An embodiment of the present invention will now be described in detail with reference to FIGS. 1–3. Referring now to the process flow diagram of FIG. 2, a wafer W to be processed by a dielectric etcher comprises a substrate 200 upon which is optionally formed a stop layer 210, such as silicon nitride, a dielectric layer 220, an optional second stop layer 230, and a second dielectric layer 240, as by deposition processing. A patterned photoresist layer 250 (i.e., a photoresist mask formed at photo cell 360) having a pattern P is formed on dielectric layer 240. Alternatively, underlying layer 240 can be a silicon nitride layer that is to be patterned to form a "hard mask" by etching using photoresist layer 250. The present invention is applicable to any and all conventional etch operations. For example, the present invention is extremely useful in "back end wiring" etch operations, wherein the underlying layer (e.g., layer 240) comprises a metal layer formed as by sputtering, which is to be etch patterned using a photoresist mask (such as mask 250) to form a wiring layer. Several such wiring layers are typically formed on top of each other, separated by dielectric layers with vias extending through them, such vias being patterned by photolithography and etching. The present invention can be employed at all these dielectric and metal layer etch operations.

Figure 3:
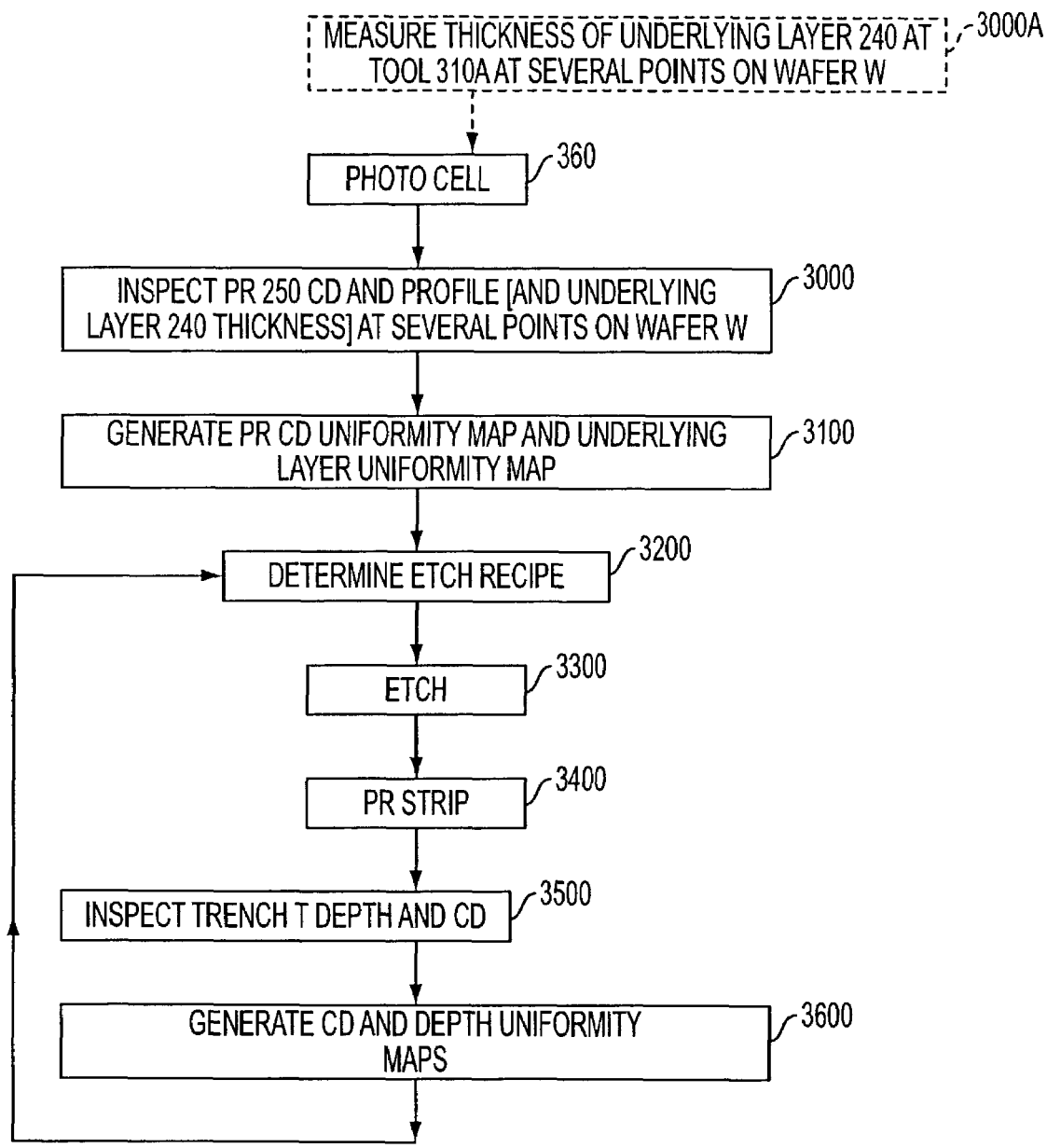
FIG. 3 is a flow chart illustrating sequential steps in a method according to an embodiment of the present invention.

As shown in the flow chart of FIG. 3, wafer W is brought from photo cell 360 to measuring tool 310 at step 3000, where the CD and profile of pattern P are optically measured, as well as the thickness of underlying layer 240. In the embodiment of the present invention wherein measuring tool 310 is for measuring CD and profile only, the thickness of underlying layer 240 is measured at thickness measuring tool 310A at step 3000A (shown in dotted lines) prior to wafer W being brought to measuring tool 310. The CD, profile and thickness measurements are taken at several predetermined locations on wafer W, and fed forward to processor 320, as shown in FIG. 1. The number of measurements is ultimately limited by the etch process throughput requirements, and influenced by the process' maturity and past performance. Generally, the less mature the process, the greater the number of measurements should be taken. Typically, about five sample measurements are taken including, e.g., top, left, bottom, right and center of the wafer.

Measuring tool 310 can directly measure CD and profile of certain patterns on photoresist layer 250, such as trenches and the like using conventional optical inspection techniques. For example, a rigorous coupled wave analysis (RCWA) can be performed, wherein a CD corresponding to a given waveform is derived by calculation, such as by a processor in the optical inspection tool. RCWA is discussed in Chateau, "Algorithm for the rigorous couple-wave analysis of grating diffraction", *Journal of the Optical Society of America*, Vol. 11, No. 4 (April 1994) and Moharam, "Stable implementation of the rigorous coupled-wave analysis for surface-relief gratings: enhanced transmittance matrix approach", *Journal of the Optical Society of America*, Vol. 12, No. 3 (May 1995). Alternatively or in addition to the above-discussed methodology, a technique can be employed wherein spectra of the pattern to be inspected and a library of reference patterns are obtained, and the spectra of the inspected pattern is compared with the library of reference patterns to find a match. This technique is described in detail in U.S. patent application Ser. No. 09/714,984, the entire disclosure of which is hereby incorporated by reference.

In this technique, measuring tool 310 is for imaging wafer W to obtain a waveform representative of the CD and profile of pattern P of photoresist layer 250. A storage medium, such as memory 340, stores a plurality of reference waveforms, each reference waveform representative of a reference pattern CD and profile comparable to pattern P. A processor, such as processor 320, is configured to identify the reference waveform that most closely matches pattern P's waveform to obtain the CD and profile of pattern P. Processor 320 can be further configured to select one of the reference waveforms as a "golden waveform", compare pattern P's waveform with the golden waveform, and compare pattern P's waveform to other reference waveforms in the library to identify the reference waveform that most closely matches pattern P's waveform when pattern P's waveform deviates from the golden waveform by more than a predetermined threshold amount.

Figure 4A:
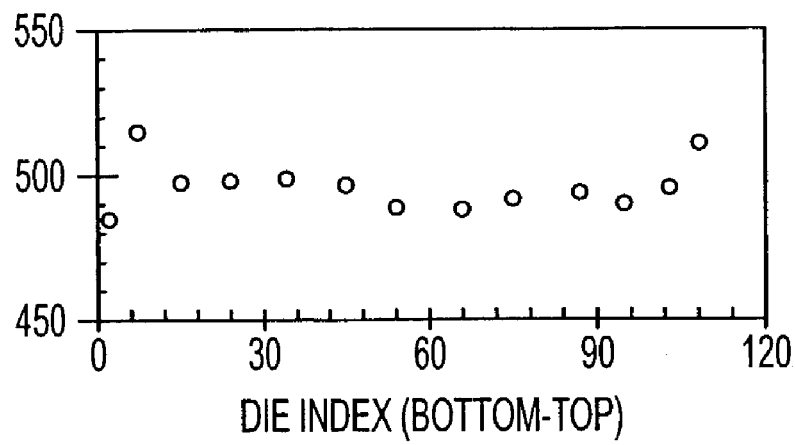
FIGS. 4A–4C are CD, thickness and etch depth maps, respectively, generated according to an embodiment of the present invention.
Figure 4B:
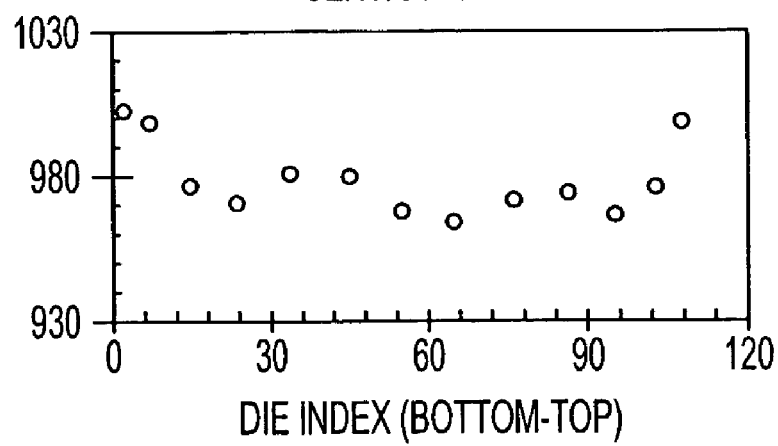
Figure 4C:
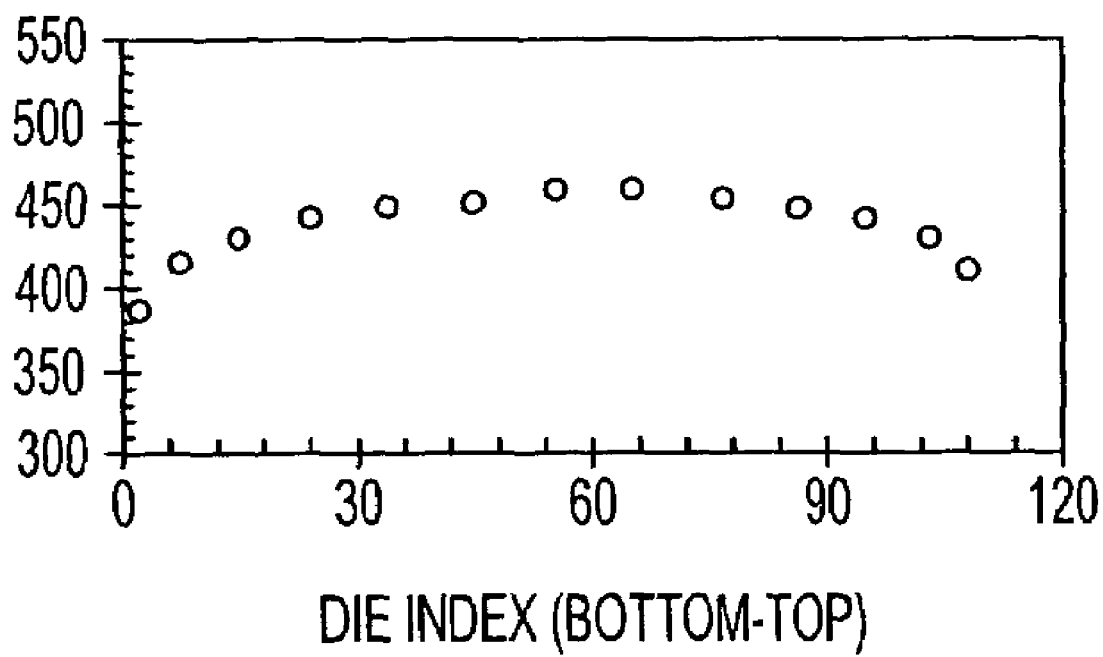

When the CD, profile and thickness have been determined, at step 3100 a photoresist CD map including profile information can be generated in a conventional manner from the collected CD and thickness data by processor 320, as shown in FIG. 4A, wherein the vertical axis represents the measured CD and the horizontal axis represents the location of the measured dies on the wafer (i.e., the "die index" is an identification number assigned to a die, and increases moving from the bottom to the top of the wafer). A conventional thickness map can also be generated, as shown in FIG. 4B, wherein the vertical axis represents the measured thickness and the horizontal axis represents the location of the measured dies on the wafer. An analogous etch depth map can also be generated, as shown in FIG. 4C. The collected CD and thickness data, such as in the form of the above-described maps, are used by processor 320 at step 3200 to determine an etch recipe (i.e., etch process parameters) for wafer W, as by an algorithm that takes into account the CD and thickness measurements as well as characteristics of etcher 370. Etch process parameters that can be adjusted by processor 320 employing such an algorithm include etch power, etch gas flow rate and pressure, magnetic field intensity and magnetic field profile. For example, if underlying layer 240 has thickness variations, the magnetic field can be adjusted to compensate. If pattern P exhibits CD uniformity issues, then the etch gas flow rate as a function of the radius of the etch chamber can be adjusted to compensate.

Figure 5:
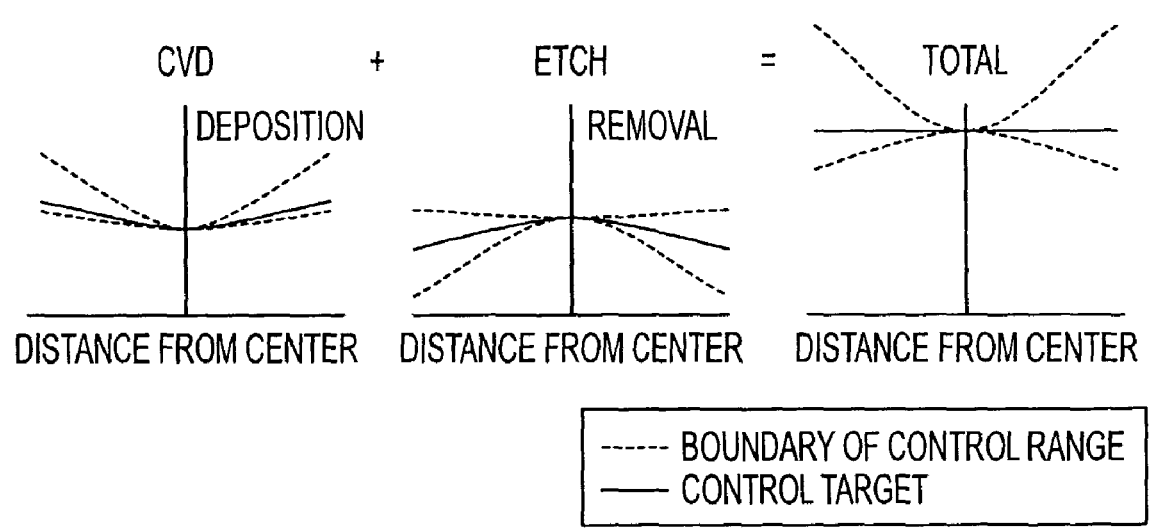
FIG. 5 is a conceptual illustration of the methodology of an embodiment of the present invention.

A generalized example is illustrated in FIG. 5, whose left-side graph shows measuring step 3000 has revealed that the thickness of underlying layer 240 increases as the distance from middle of wafer W increases. The middle graph of FIG. 5 shows the etch recipe chosen according to the present invention to compensate for the thickness variation. The chosen etch recipe is such that the material removed increases as the distance from the center of wafer W increases. The result is shown in the right-side graph; that is, uniform post-etch CD, depth and thickness. Thus, by operating processing tools (e.g., the etcher) in a non-optimal way tailored for each wafer, the present invention enables the user to obtain their desired results.

The algorithm used by processor 320 to adjust the etch recipe for wafer W is developed by performing a design of experiments (DOE) which determines the effects of process parameter changes on etch performance. For example, the DOE experientially determines how a change in etch gas flow rate effects CD uniformity and etch rate uniformity. The DOE is thereby used to "characterize" etch chamber 370. DOE chamber characterization is also done as the etcher "ages"; that is, etch performance changes are noted as a function of the number of etch cycles performed after an etcher cleaning step. A process drift timeline can thereby be generated, so process drift can be taken into account by the algorithm, as explained hereinbelow. The algorithm can be stored by processor 320 and/or by memory 340.

Referring again to FIG. 3, at step 3300 wafer W is etched using the etch recipe determined by processor 320 using the experimentally determined algorithm. The result is shown at the right side of FIG. 2, wherein a trench T is formed in underlying layer 240. Wafer W is then brought to a photoresist ash strip chamber (see step 3400), and brought back to measuring tool 310 at step 3500. The CD and depth of trench T are measured at several locations on wafer W, such as the locations where the pre-etch measurements of photoresist layer 250 were taken at step 3000.

The collected CD and depth data is supplied to processor 320; for example, in the form of CD and depth maps, generated at step 3600, comparable to those shown in FIGS. 4A and 4C. Deviations from target results are used by the algorithm to adjust the etch recipe for the next wafer to be etched. For example, from the generated CD and depth maps and the previously developed DOE modelling, etcher process drift can be determined; that is, etcher process "age" or where the etcher is on its process timeline. The etch recipe can then be adjusted for the next wafer, so the etch results are closer to the target. Moreover, if the measured dimensional variation is outside predetermined boundaries, or if the processing results change dramatically from one wafer to the next, an alarm can be generated to indicate the etcher should be taken out of service; e.g., for repairs or maintenance. The depth map can also be fed forward to a chemical-mechanical polishing (CMP) tool, to adjust the CMP recipe for the wafer.

Thus, the present invention adjusts the etch recipe based on two factors: (1) photoresist CD and underlying layer thickness variation of an incoming wafer ("feed forward"), and (2) the etcher process age ("feedback").

In further embodiments of the present invention, an apparatus for processing a semiconductor wafer is provided wherein a wafer is removed from a wafer cassette, a CD and profile of a pattern on a patterned layer formed on the wafer is measured, and the thickness of an underlying layer is measured, using an optical measuring tool, at several locations on the wafer. A process, such as an etch process, is then performed on the wafer using a set of process parameter values, such as an etch recipe, selected based on the pattern CD and profile measurements and the thickness measurements. Post-etch processing, such as ash stripping and wet cleaning, are optionally performed by the apparatus, then a CD and depth of a structure formed in the underlying layer by the etch process are measured at several locations before the wafer is returned to a cassette. The post-etch measurements are fed back to the etcher to adjust the etch recipe for a subsequent wafer. All of the transfer and processing steps performed by the apparatus are performed in a clean environment, thereby increasing yield by avoiding exposing the wafer to the atmosphere and possible contamination between steps.

These embodiments of the present invention provide for pre-etch CD, profile and thickness measurements of every wafer and adjustment of the etch recipe for every wafer according to its CD, profile and thickness measurements to correct for process variations in previously visited tools, such as deposition uniformity variations at a deposition module and/or exposure and focus variations at a photo cell. The present invention also provides for etch recipe adjustment for etcher process drift.

An apparatus for processing a semiconductor wafer according to an embodiment of the present invention will now be described with reference to FIG. 6A. The apparatus comprises a chamber or "mainframe" 901, such as the Entek™ processing system, available from Applied Materials of Santa Clara, Calif., for mounting a plurality of processing chambers, such as conventional etch processors 902, such as eMaX™ dielectric etch chambers available from Applied Materials of Santa Clara, Calif., and one or more transfer chambers 903, also called "load locks". In one embodiment of the present invention, four etch processors 902 are mounted to mainframe 901. In one exemplary embodiment, two etchers 902 are used for etching (e.g., for trench etch and for via etch), one is used for post-etch cleaning (i.e., removing photoresist polymers and other residue from wafers after etching) and another is used for a nitride open step. Mainframe 901 is capable of maintaining a vacuum environment in its interior. A robot 904 is provided for transferring wafers between processing chambers 902 and transfer chambers 903.

Transfer chambers 903 are connected to a factory interface 905, also known as a "mini environment", which maintains a controlled environment. A measurement tool 906, such as an optical measurement tool utilizing scatterometry or reflectometry techniques, is mounted inside factory interface 905. An example of a tool that can be used as measurement tool 906 is measuring tool 310 described above (see FIG. 1), which can include the measurement tool described in U.S. Pat. No. 5,963,329. A processor (i.e., a processor corresponding to processor 320) to provide etcher 902 an etch recipe based on the wafer CD, profile, and thickness measurements as described above can be part of etcher 902 or mainframe 901. One or more robots 907, or a track robot, are also mounted inside factory interface 905 for transferring wafers between transfer chambers 903, measurement tool 906 and standard wafer cassettes 908 removably attached to factory interface 905. Mainframe 901, transfer chambers 903, factory interface 905 and robots 904, 907 are all parts of a conventional processing system such as the Applied Materials Centura™, and communicate with each other while maintaining a clean, controlled environment. Such conventional processing systems further comprise a processor, such as a computer (not shown) to electronically control the operation of the system, including the transfer of wafers from one part of the system to another.

Figure 7:
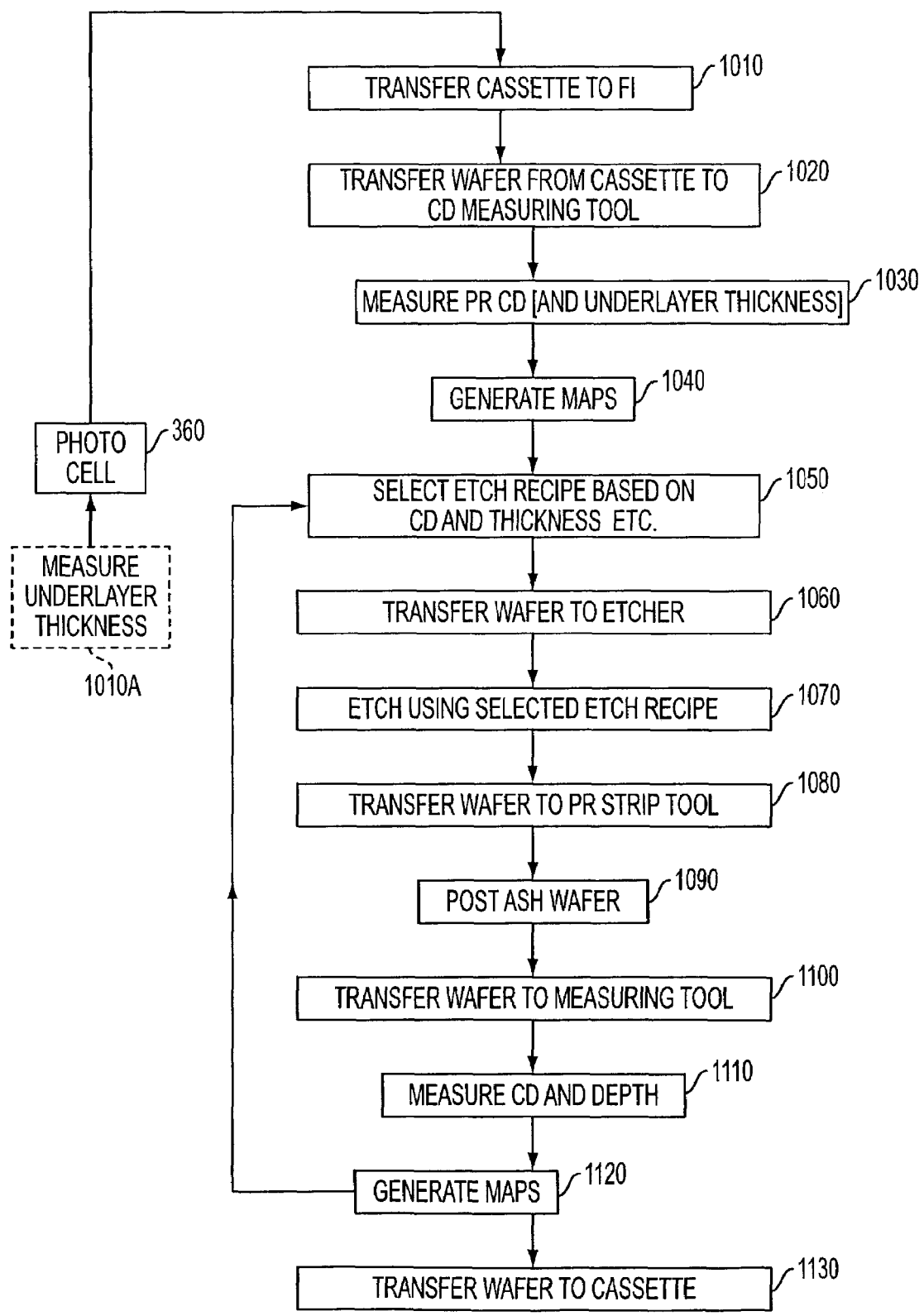
FIG. 7 is a flow chart illustrating sequential steps in a method according to an embodiment of the present invention.

The operation of the apparatus according to this embodiment of the present invention will now be described with reference to the flow chart of FIG. 7. After a plurality of wafers are processed at a processing tool, such as a photo cell as described above, to form a photoresist mask on an underlying layer, they are loaded into a cassette 908, and the cassette is transferred to factory interface 905 at step 1010. A wafer is then unloaded from cassette 908 and transferred to measurement tool 906 by robot 907 (step 1020), and the CD and profile of a pattern on the photoresist are measured at a plurality of different locations on the wafer at step 1030, along with the thickness of the underlying layer at those locations. In an alternative embodiment of the present invention where measuring tool 906 is for measuring CD and profile only, the thickness of underlying layer 240 is measured at thickness measuring tool 310A at step 1010A (shown in dotted lines) prior to wafer W being brought to photo cell 360. Measurements are taken as described above in relation to the previous embodiment of the present invention; i.e., either directly or via waveform imaging and matching.

Optionally, at step 1040, a CD map and a thickness map are generated using the pattern dimension and underlying layer thickness measurements. At step 1050, an etch recipe for the wafer is selected based on the CD and thickness measurements or maps, as explained above.

At step 1060, the wafer is transferred from measurement tool 906 to etcher 902 using robot 907 to move the wafer to transfer chamber 903, and using robot 904 to move the wafer to etcher 902. The wafer is then etched (step 1070), and transferred to a photoresist stripping chamber 902 (step 1080), such as a conventional ash strip chamber, for removal of the photoresist (step 1090). Next, the wafer is transferred back to measurement tool 906 for a post-etch CD, profile and depth measurement (steps 1100 and 1110) before being loaded into cassette 908 at step 1130. At step 1120, CD and depth maps are generated by processor 320, and deviations from target results are used by the algorithm to adjust the etch recipe for the next wafer to be etched, as explained above.

Figure 6A:
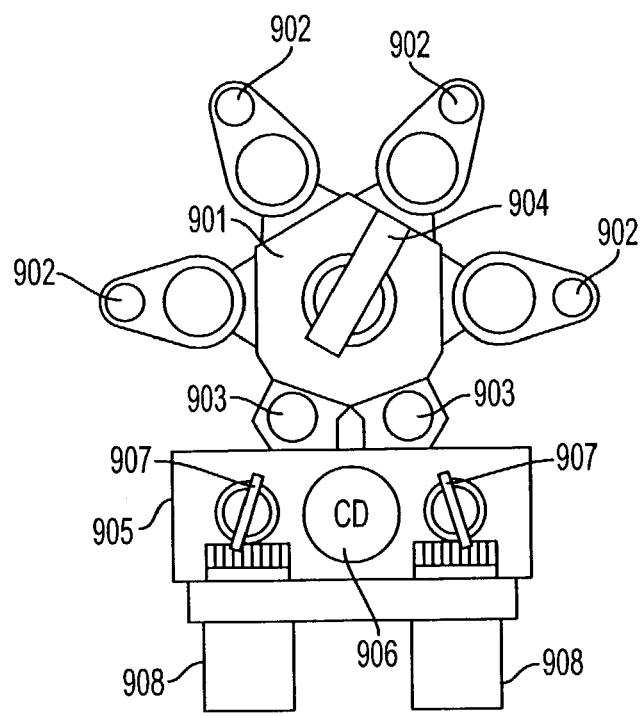
FIGS. 6A–D schematically illustrate processing modules according to embodiments of the present invention.
Figure 6B:
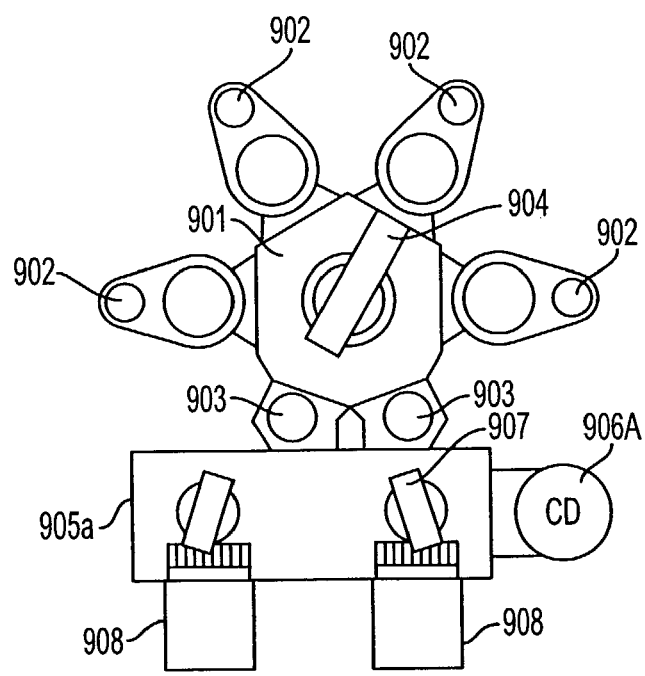

In a further embodiment of the present invention shown in FIG. 6B, factory interface 905a has a CD measurement tool 906a mounted to it (instead of inside it as in the embodiment of FIG. 6A). The apparatus of FIG. 6B operates according to the flow chart of FIG. 7 as described above.

Figure 6C:
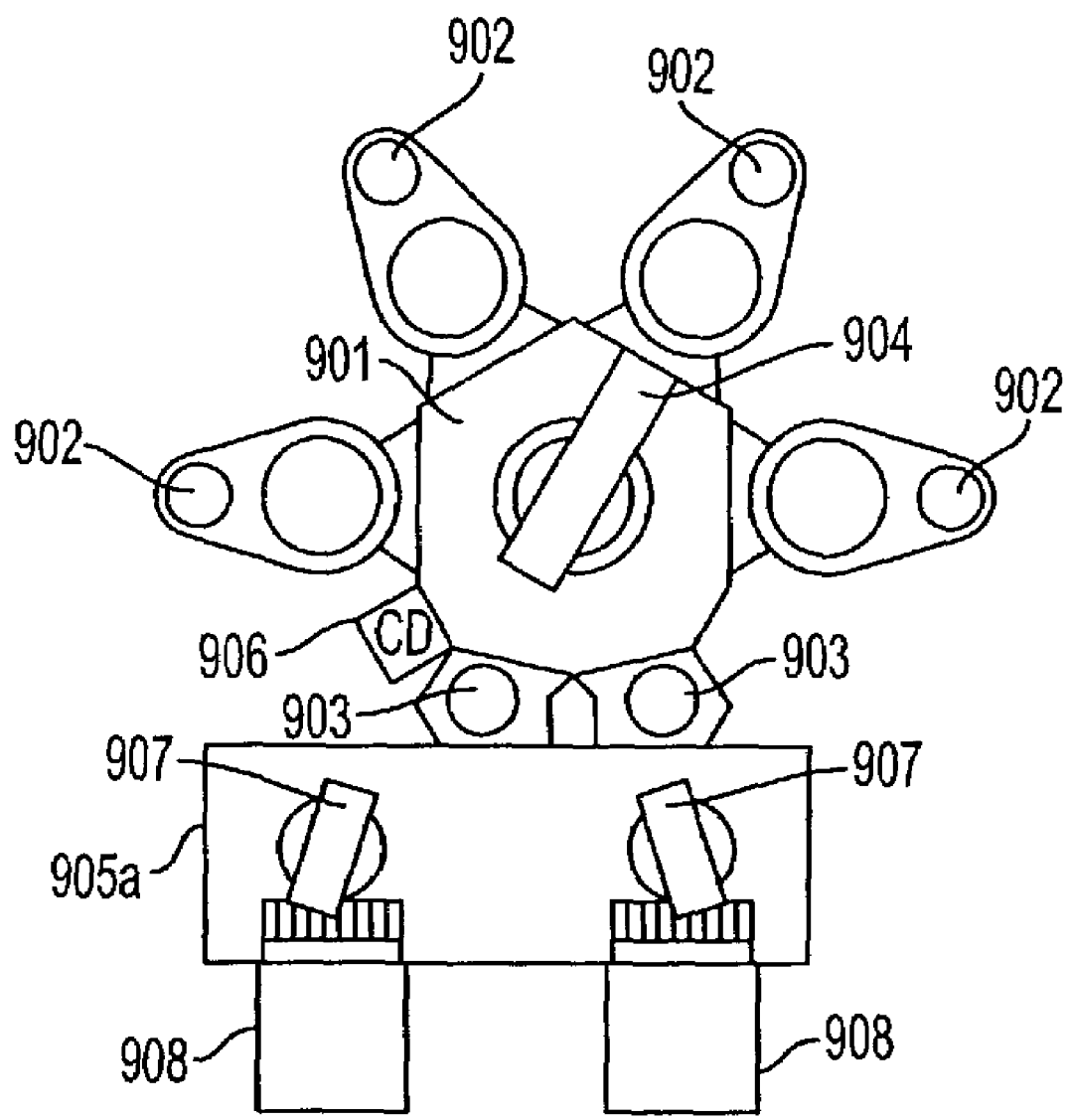

In a still further embodiment of the present invention illustrated in FIG. 6C, measurement tool 906a is mounted on mainframe 901 rather than factory interface 905a. The apparatus of FIG. 6C operates according to the flow chart of FIG. 7 as described above.

Figure 6D:
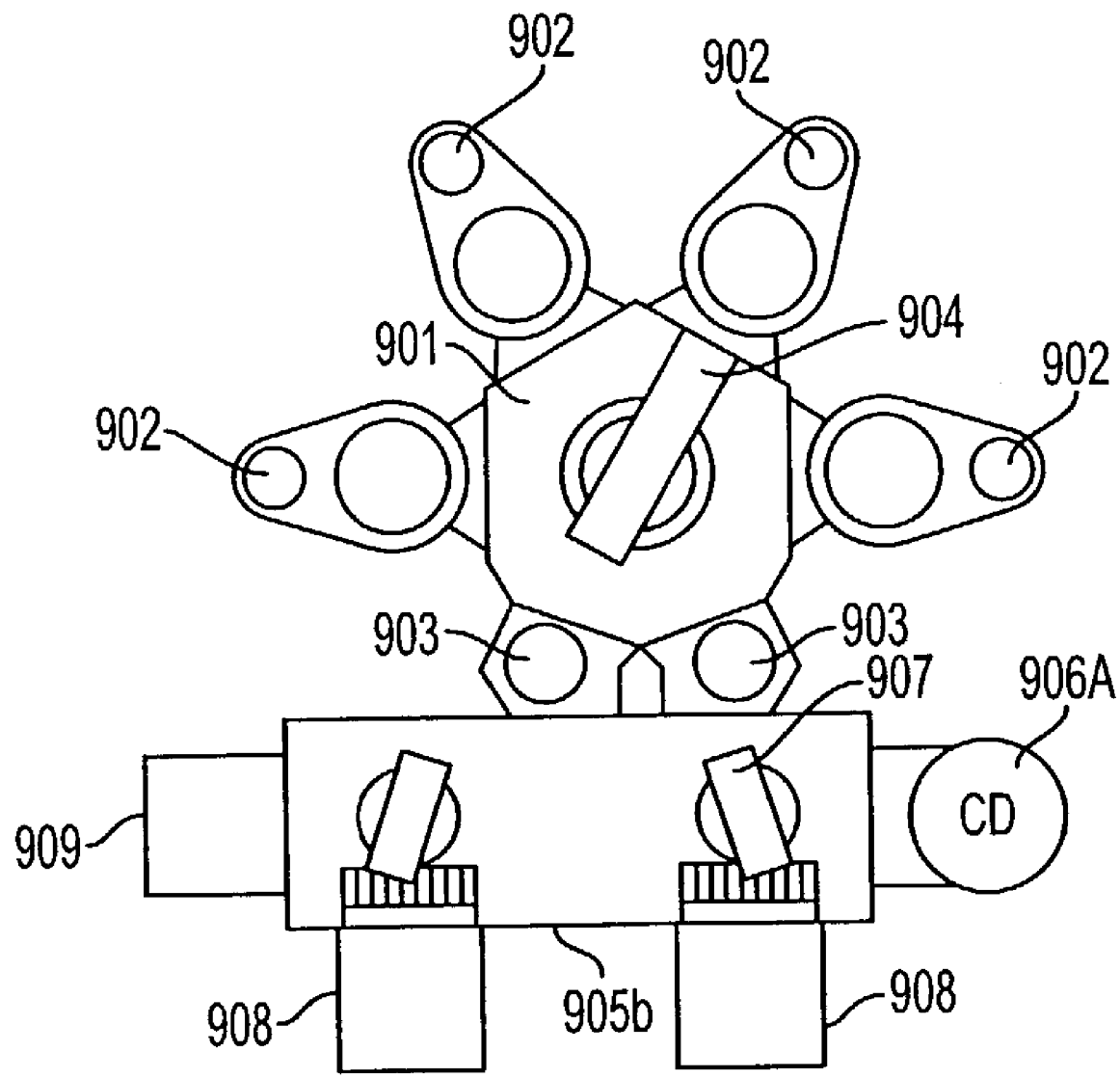

In another embodiment of the present invention illustrated in FIG. 6D, factory interface 905b has a measurement tool 906a and a conventional wet clean chamber 909 mounted to it. Wet clean chamber 909 can be a single wafer cleaning station using ultrasonic transducers. One of the chambers 902 on mainframe 901 is a conventional ash strip chamber, as discussed above. After a wafer is etched, it is transferred to ash strip chamber 902 for photoresist removal (steps 1080 and 1090 of FIG. 7), then it is transferred to wet clean chamber 909 and cleaned prior to or after being transferred to measurement tool 906a in step 1110.

The embodiments of the present invention illustrated in FIGS. 6A–D provide pre-etch CD, profile and thickness measurement, etching, cleaning, and post-etch CD measurement entirely under controlled environmental conditions. By providing etching, cleaning and measurement tools on the mainframe and/or factory interface, the wafer can be etched, cleaned and inspected before being returned to a cassette, thereby reducing processing time and cost. Moreover, the embodiments of FIGS. 6A–D provide feedback and feed forward of measurement data in real time for every wafer, thereby enabling etch processing to be customized for every wafer to increase yield. Thus, the present invention provides increases in yield and decreases in production costs vis-à-vis prior art systems, wherein feedback from CD measurements, if any, is on a lot-to-lot basis rather than for every wafer, and wafers must be exposed to the atmosphere between measuring, etching and cleaning steps.

The inventive process control technique enables lot to lot CD variations to be reduced without significantly reducing production throughput by using data gathered during the inspection process to adjust etch process parameters.

The present invention is applicable to the manufacture of various types of semiconductor devices, particularly high density semiconductor devices having a design rule of about 0.18μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only a few examples of the versatility of the present invention are shown and described in the present disclosure. It is to be understood that the present invention is capable of use in various other combinations and environments and is capable of changes or modifications within the scope of the inventive concept as expressed herein.

What is claimed is:

1. An apparatus for processing a semiconductor wafer, comprising:
    a first measuring tool for measuring the thickness of an underlying layer formed on the wafer at a plurality of different predetermined locations on the wafer;
    a second measuring tool for measuring a dimension of a pattern on a patterned layer formed on the underlying layer at the plurality of different predetermined locations on the wafer;
    a processing tool for performing a process on the wafer using a first set of process parameter values; and
    a processor configured to;
    control the first measuring tool to measure the thickness at the plurality of different predetermined locations,
    control the second measuring tool to measure the dimension at the plurality of different predetermined locations, and
    select the first set of process parameter values based on the measurements of the dimension and the thickness.

2. The apparatus of claim 1, wherein the second measuring tool is for measuring a dimension of a structure formed in the underlying layer by the process at the predetermined locations, and the processor is further configured to select a second set of process parameter values for a subsequently processed wafer using the measurements of the structure.

3. The apparatus of claim 2, wherein the second measuring tool is for measuring a CD and a profile of the pattern on the patterned layer, and for measuring a CD and a depth of the structure in the underlying layer.

4. The apparatus of claim 2, wherein the process tool comprises an etcher, and the first and second process parameter values each comprise an etch recipe.

5. The apparatus of claim 4, wherein the first and second set of process parameter values include a gas flow rate, a magnetic field intensity and a magnetic field profile.

6. The apparatus of claim 1, wherein the first and second measuring tools are included in a single optical measuring tool.

7. The apparatus of claim 6, wherein the optical measuring tool employs at least one of scatterometry or reflectometry.

8. The apparatus of claim 3, wherein the processor is configured to:
    generate a CD map and a thickness map using the pattern dimension and thickness measurements;
    store information relating to the operating characteristics of the processing tool; and
    determine the first set of process parameter values using the CD and thickness maps and the operating characteristics.

9. The apparatus of claim 2, wherein the processor is configured to:
    determine a process drift by determining a change in the operating characteristics of the processing tool as a function of a quantity of processing cycles performed by the processing tool; and
    select the second set of process parameter values for the subsequently processed wafer using the process drift.

10. The apparatus of claim 1, wherein the first and second measuring tools are separate optical measuring tools.

* * * * *